United States Patent
Lee et al.

(10) Patent No.: US 11,043,512 B2
(45) Date of Patent: Jun. 22, 2021

(54) DISPLAY APPARATUS

(71) Applicant: SAMSUNG DISPLAY CO., LTD., Yongin-si (KR)

(72) Inventors: Donghyun Lee, Yongin-si (KR); Deukjong Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/742,265

(22) Filed: Jan. 14, 2020

(65) Prior Publication Data

US 2020/0152665 A1    May 14, 2020

Related U.S. Application Data

(60) Continuation of application No. 16/039,454, filed on Jul. 19, 2018, now Pat. No. 10,566,353, which is a (Continued)

(30) Foreign Application Priority Data

Apr. 4, 2016    (KR) .................. 10-2016-0041257

(51) Int. Cl.
*H01L 27/12*    (2006.01)
*H01L 27/32*    (2006.01)
(Continued)

(52) U.S. Cl.
CPC .......... *H01L 27/124* (2013.01); *H01L 23/535* (2013.01); *H01L 27/1248* (2013.01);
(Continued)

(58) Field of Classification Search
CPC ......... H01L 29/41733; H01L 29/42384; H01L 51/0097; H01L 23/535; H01L 27/124;
(Continued)

(56) References Cited

U.S. PATENT DOCUMENTS 6,762,564 B2    7/2004    Noguchi et al.
7,224,118 B2    5/2007    Yamazaki et al.
(Continued)

FOREIGN PATENT DOCUMENTS

JP    2003-330387    11/2003
JP    2005-31651    2/2005
(Continued)

OTHER PUBLICATIONS

First Office Action dated Sep. 18, 2020 in Corresponding Taiwanese Patent Application No. 106110556.
(Continued)

*Primary Examiner* — Ida M Soward
(74) *Attorney, Agent, or Firm* — F. Chau & Associates, LLC

(57) ABSTRACT

A display apparatus includes a substrate, a circuit, and a pixel electrode. The substrate includes a display area and a peripheral area outside the display area. The circuit is disposed in the display area. The circuit includes a plurality of conductive layers, and each conductive layer contacts a corresponding inorganic layer arranged directly below the each conductive layer. The pixel electrode is arranged over the circuit and is electrically connected to at least one of the conductive layers.

6 Claims, 11 Drawing Sheets

Related U.S. Application Data division of application No. 15/420,346, filed on Jan. 31, 2017, now Pat. No. 10,050,063.

(51) Int. Cl.
| | | |
|---|---|---|
| *H01L 29/41* | (2006.01) | |
| *H01L 29/423* | (2006.01) | |
| *H01L 51/00* | (2006.01) | |
| *H01L 23/535* | (2006.01) | |
| *H01L 29/417* | (2006.01) | |

(52) U.S. Cl.
CPC ...... *H01L 27/3258* (2013.01); *H01L 27/3276* (2013.01); *H01L 29/41733* (2013.01); *H01L 29/42384* (2013.01); *H01L 51/0097* (2013.01); *Y02E 10/549* (2013.01)

(58) Field of Classification Search
CPC ............. H01L 27/1248; H01L 27/3258; H01L 27/3276
See application file for complete search history.

(56) References Cited

U.S. PATENT DOCUMENTS

| | | | | |
|---|---|---|---|---|
| 7,638,772 | B2 * | 12/2009 | Watanabe | ............. G01T 1/2928 |
| | | | | 250/370.08 |
| 7,868,961 | B2 | 1/2011 | Yasukawa | |
| 8,188,941 | B2 | 5/2012 | Iida et al. | |
| 8,247,809 | B2 | 8/2012 | Kim | |
| 8,426,299 | B2 * | 4/2013 | Kim | .................... H01L 21/0273 |
| | | | | 438/585 |
| 9,508,758 | B2 | 11/2016 | Tsuno et al. | |
| 9,563,100 | B2 * | 2/2017 | Masuyama | ............. G02F 1/025 |
| 9,608,049 | B2 | 3/2017 | Lee | |
| 9,835,913 | B2 * | 12/2017 | Pellerite | ................. B82Y 10/00 |
| 9,853,164 | B2 | 12/2017 | Hara et al. | |
| 10,050,063 | B2 | 8/2018 | Lee et al. | |
| 10,064,252 | B2 | 8/2018 | Tada et al. | |
| 2001/0028060 | A1 | 10/2001 | Yamazaki et al. | |
| 2006/0244371 | A1 | 11/2006 | Cok et al. | |
| 2008/0118762 | A1 * | 5/2008 | Morimoto | ................ H01J 11/44 |
| | | | | 428/457 |
| 2009/0101904 | A1 | 4/2009 | Yamamoto et al. | |
| 2012/0015181 | A1 | 1/2012 | Seo et al. | |
| 2014/0361261 | A1 | 12/2014 | Choi et al. | |
| 2015/0076458 | A1 | 3/2015 | Lee et al. | |
| 2015/0200240 | A1 | 7/2015 | Cho et al. | |
| 2015/0280154 | A1 | 10/2015 | Jang et al. | |
| 2015/0372072 | A1 | 12/2015 | Xiong et al. | |
| 2016/0147109 | A1 | 5/2016 | Yamazaki et al. | |
| 2016/0204347 | A1 | 7/2016 | Kim et al. | |
| 2016/0283005 | A1 | 9/2016 | Lee | |
| 2016/0336386 | A1 | 11/2016 | Saito | |
| 2017/0280531 | A1 | 9/2017 | Tada et al. | |
| 2017/0287938 | A1 | 10/2017 | Lee et al. | |
| 2018/0350841 | A1 | 12/2018 | Lee et al. | |

FOREIGN PATENT DOCUMENTS

| | | | |
|---|---|---|---|
| JP | 2005-215003 | | 8/2005 |
| JP | 4353237 | | 8/2009 |
| KR | 20100074748 A | * | 7/2010 |
| TW | 2014-01524 | | 1/2014 |
| WO | 2015-087466 | | 6/2015 |

OTHER PUBLICATIONS

Office Action dated Apr. 24, 2019 in Corresponding U.S. Appl. No. 16/039,454.

Notice of Allowance dated Oct. 9, 2019 in Corresponding U.S. Appl. No. 16/039,454.

European Extended Search Report for Application No. 171640030.0 dated Oct. 10, 2017 in Corresponding U.S. Appl. No. 15/420,346.

* cited by examiner

DISPLAY APPARATUS

CROSS-REFERENCE TO RELATED APPLICATIONS

This application is a continuation of U.S. patent application Ser. No. 16/039,454 filed Jul. 19, 2018, which is a divisional application of U.S. patent application Ser. No. 15/420,346 filed Jan. 31, 2017, issued as U.S. Pat. No. 10,050,063 on Aug. 14, 2018, which claims priority under 35 U.S.C. § 119 to Korean Patent Application No. 10-2016-0041257, filed on Apr. 4, 2016, the disclosures of which are incorporated by reference herein in their entirety.

TECHNICAL FIELD

Exemplary embodiments of the present disclosure relate to a display apparatus, and more particularly, to a display apparatus in which a short among conductive layers may be prevented.

DISCUSSION OF THE RELATED ART

A display apparatus includes a display device and electronic devices that control an electric signal applied to the display device. The electronic devices may include, for example, a thin-film transistor (TFT), a capacitor, and a plurality of wires.

To correctly control emission of the display device and a degree of the emission of the display device, the number of TFTs electrically connected to the display device may be increased, and the number of wires delivering electric signals to the TFTs may also be increased.

SUMMARY

According to an exemplary embodiment of the present disclosure, a display apparatus includes a substrate, a circuit, and a pixel electrode. The substrate includes a display area and a peripheral area outside the display area. The circuit is disposed in the display area. The circuit includes a plurality of conductive layers. Each conductive layer contacts a corresponding inorganic layer arranged directly below the each conductive layer. The pixel electrode is arranged over the circuit and is electrically connected to at least one of the conductive layers.

In an exemplary embodiment, a bottom surface of each conductive layer directly contacts the corresponding inorganic layer arranged directly below the each conductive layer.

In an exemplary embodiment, the conductive layers include a first conductive layer and a second conductive layer disposed above the first conductive layer. The inorganic layer includes an interlayer insulating layer, a first inorganic layer, and a second inorganic layer. The interlayer insulating layer is arranged below the first conductive layer. The first inorganic layer is arranged between the first conductive layer and the second conductive layer and includes a first opening that exposes at least a portion of a surface of the first conductive layer. The second conductive layer contacts the first conductive layer via the first opening. The second inorganic layer covers the second conductive layer and contacts the first inorganic layer outside the second conductive layer.

In an exemplary embodiment, the second inorganic layer includes a second opening that exposes at least a portion of a surface of the second conductive layer.

In an exemplary embodiment, the display apparatus further includes a planarization layer covering the second inorganic layer and including a contact hole corresponding to the second opening. At least a portion of the surface of the second conductive layer is exposed by the contact hole and the second opening, and the pixel electrode is arranged over the planarization layer and is electrically connected to the second conductive layer.

In an exemplary embodiment, the interlayer insulating layer extends over the peripheral area, and the display apparatus further includes a first wire, a second wire, and an organic material layer covering the first wire. The first wire is arranged over the interlayer insulating layer in the peripheral area and includes a same material as the first conductive layer. The second wire is arranged over the organic material layer in the peripheral area and includes a same material as the second conductive layer.

In an exemplary embodiment, the first inorganic layer extends over the peripheral area and covers the first wire, the organic material layer is arranged over the first inorganic layer, and the second inorganic layer extends over the peripheral area and covers the second wire.

In an exemplary embodiment, the substrate includes a first area including the display area, a second area including at least a portion of the peripheral area, and a bending area disposed between the first area and the second area. The substrate is bent in the bending area with respect to a bending axis. The first inorganic layer includes an opening portion corresponding to the bending area, the organic material layer fills the opening portion, and the second inorganic layer includes an additional opening portion corresponding to the opening portion.

In an exemplary embodiment, the first wire and the second wire cross each other on different layers.

In an exemplary embodiment, the substrate is bent in an area where the organic material layer is disposed.

In an exemplary embodiment, the display apparatus further includes a thin-film transistor (TFT) disposed in the display area. The TFT includes an active layer and a gate electrode. The active layer includes a channel region, a source region arranged at a first side of the channel region, and a drain region arranged at a second side of the channel region that opposes the first side. The gate electrode is arranged above the active layer and is insulated from the active layer, and the first conductive layer is electrically connected to the source region or the drain region.

In an exemplary embodiment, the second conductive layer is electrically connected to the source region or the drain region.

In an exemplary embodiment, a lower power supply line is arranged on a same layer as the first conductive layer in the display area, and an upper power supply line is arranged on a same layer as the second conductive layer in the display area. The lower power supply line and the upper power supply line are electrically connected to each other.

In an exemplary embodiment, the first inorganic layer is disposed between the lower power supply line and the upper power supply line. The first inorganic layer includes an additional opening that exposes at least a portion of a surface of the lower power supply line, and the upper power supply line contacts the lower power supply line via the additional opening.

According to an exemplary embodiment of the present disclosure, a display apparatus includes a substrate, a plurality of conductive layers disposed on the substrate, a plurality of inorganic layers disposed on the substrate, and a pixel electrode disposed on the substrate and electrically connected to at least one of the conductive layers. A bottom surface of each conductive layer contacts a top surface of a corresponding one of the inorganic layers disposed below the each conductive layer.

In an exemplary embodiment, the bottom surface of the each conductive layer directly contacts the top surface of the corresponding one of the inorganic layers.

In an exemplary embodiment, the each conductive layer is disposed directly above the corresponding one of the inorganic layers.

In an exemplary embodiment, the conductive layers include a first conductive layer and a second conductive layer disposed above the first conductive layer. The inorganic layers include an interlayer insulating layer, a first inorganic layer, and a second inorganic layer. The interlayer insulating layer is disposed below the first conductive layer. The first inorganic layer is disposed between the first conductive layer and the second conductive layer and includes a first opening that exposes at least a portion of the first conductive layer. The second conductive layer contacts the first conductive layer via the first opening. The second inorganic layer covers the second conductive layer and contacts the first inorganic layer outside the second conductive layer.

In an exemplary embodiment, the second inorganic layer includes a second opening that exposes at least a portion of the second conductive layer.

In an exemplary embodiment, the display apparatus includes a planarization layer covering the second inorganic layer and including a contact hole corresponding to the second opening. The portion of the second conductive layer is exposed by the contact hole and the second opening, and the pixel electrode is disposed over the planarization layer and is electrically connected to the second conductive layer.

BRIEF DESCRIPTION OF THE DRAWINGS

The above and other features of the present disclosure will become more apparent by describing in detail exemplary embodiments thereof with reference to the accompanying drawings, in which.

DETAILED DESCRIPTION OF THE EXEMPLARY EMBODIMENTS

Figure 1:
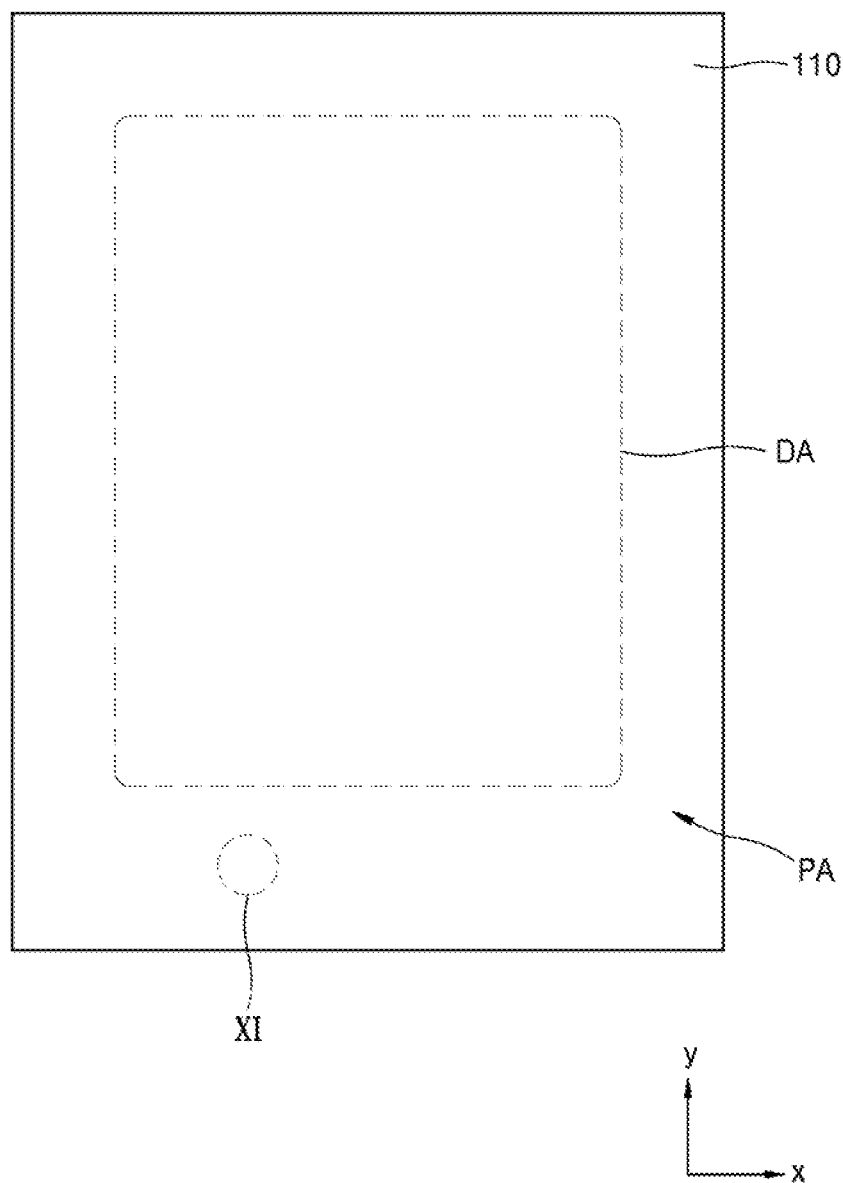
FIG. 1 is a plan view illustrating a portion of a display apparatus, according to an exemplary embodiment of the present disclosure.

Exemplary embodiments of the present disclosure will be described more fully hereinafter with reference to the accompanying drawings. In the drawings, the size and relative sizes of layers and regions may be exaggerated for clarity. Like reference numerals may refer to like elements throughout the accompanying drawings.

It will be understood that when various elements including, for example, a layer, a film, a region, a plate, etc. are referred to as being "over" another layer, film, region, or plate, it may be directly on the other layer, film, region, or plate, or one or more intervening layers, films, regions, or plates may be interposed between it and the other layer, film, region, or plate.

Hereinafter, it is to be understood that the X-axis, Y-axis, and Z-axis are not limited to three axes on a rectangular coordinate system. For example, the X-axis, Y-axis, and Z-axis may be substantially perpendicular to one another or may indicate different directions that are not substantially perpendicular to one another.

When two elements are described as being substantially parallel or perpendicular to each other, it is to be understood that the two elements are exactly parallel or perpendicular to each other, or are approximately parallel or perpendicular to each other as would be understood by a person having ordinary skill in the art. Further, when two or more events are described as occurring substantially at the same time or occurring substantially simultaneously, it is to be understood that the events may occur at exactly the same time or at about the same time as would be understood by a person having ordinary skill in the art. Further, when two or more elements or values are described as being substantially the same as or about equal to each other, it is to be understood that the elements or values are identical to each other, indistinguishable from each other, or distinguishable from each other but functionally the same as each other as would be understood by a person having ordinary skill in the art.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

It will be understood that when a component, such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component.

It will be further understood that the terms "first," "second," "third," etc. are used herein to distinguish one element from another, and the elements are not limited by these terms. Thus, a "first" element in an exemplary embodiment may be described as a "second" element in another exemplary embodiment.

FIG. 1 is a plan view illustrating a portion of a display apparatus, according to an exemplary embodiment of the present disclosure. As illustrated in FIG. 1, the display apparatus according to an exemplary embodiment includes a substrate 110. The substrate 110 included in the display apparatus according to the exemplary embodiment illustrated in FIG. 1 has a display area DA and a peripheral area PA outside the display area DA. Hereinafter, the display apparatus may also be referred to as an organic light-emitting display apparatus. Various display devices such as, for example, an organic light-emitting device may be placed in the display area DA of the substrate 110. Various wires for delivering an electric signal to be applied to the display area DA may be placed in the peripheral area PA of the substrate 110. Hereinafter, it is assumed that the display apparatus includes the organic light-emitting device as the display device. However, the present disclosure is not limited thereto.

Figure 2:
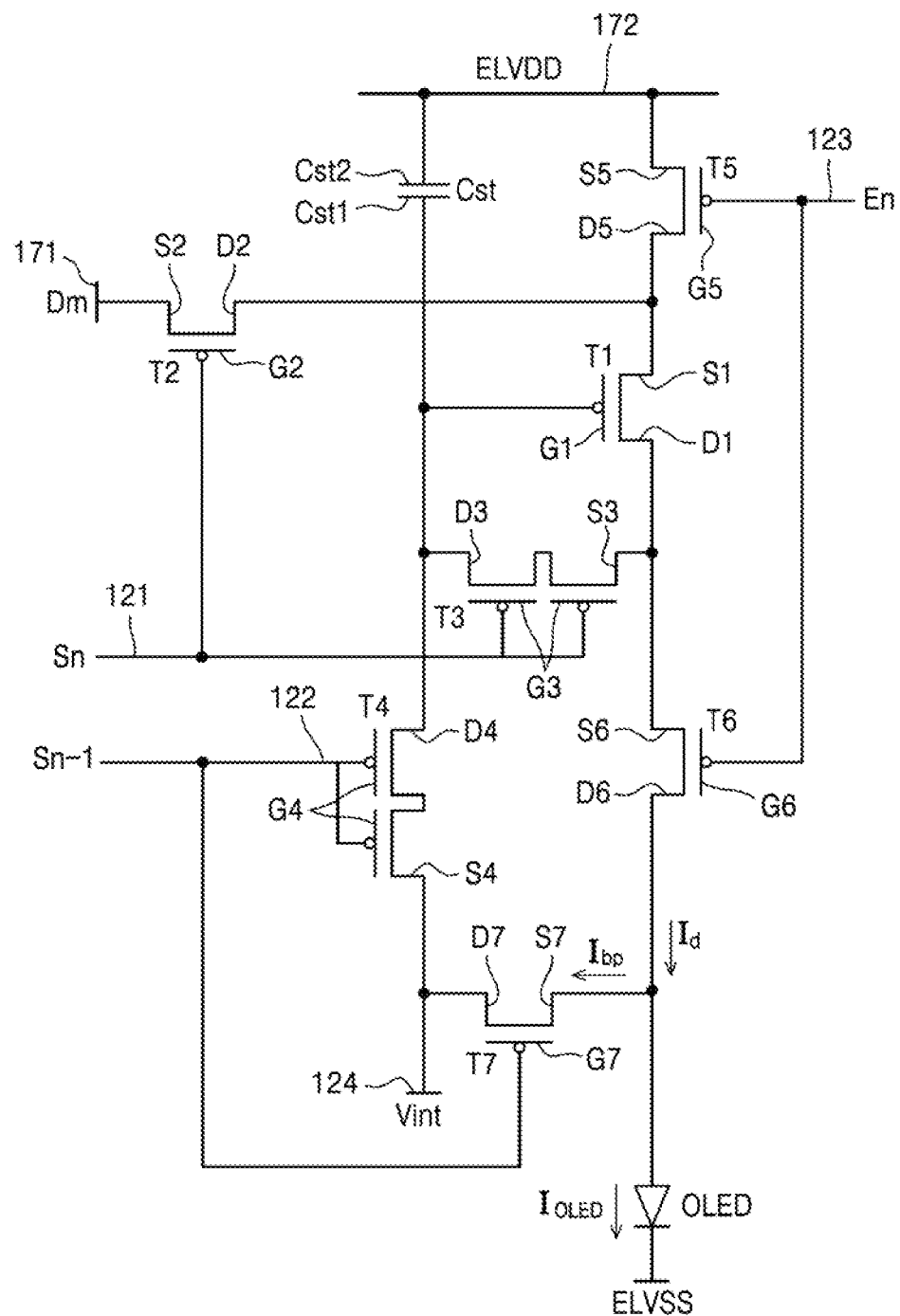
FIG. 2 is an equivalent circuit diagram illustrating one subpixel in the display apparatus of FIG. 1, according to an exemplary embodiment of the present disclosure.

FIG. 2 is an equivalent circuit diagram illustrating one subpixel in the display area DA of the display apparatus of FIG. 1, according to an exemplary embodiment of the present disclosure. FIG. 2 illustrates a case in which the subpixel includes an organic light-emitting device OLED.

As illustrated in FIG. 2, one subpixel of the display apparatus according to an exemplary embodiment includes a plurality of signal lines 121, 122, 123, 124, and 171, a plurality of thin-film transistors (TFTs) T1, T2, T3, T4, T5, T6, and T7 that are connected to the signal lines 121, 122, 123, 124, and 171, a storage capacitor Cst, power supply lines 172 and 178 (refer to FIGS. 3, 7, and 8 regarding power supply line 178), and the organic light-emitting device OLED. The signal lines 121, 122, 123, 124, and 171, and/or the power supply lines 172 and 178, may be shared among a plurality of subpixels.

The TFTs T1, T2, T3, T4, T5, T6, and T7 include the driving TFT T1, the switching TFT T2, the compensation TFT T3, the initialization TFT T4, the driving control TFT T5, the emission control TFT T6, and the bypass TFT T7.

Referring to the signal lines 121, 122, 123, 124, and 171, the scan line 121 delivers a scan signal Sn, the previous scan line 122 delivers a previous scan signal Sn−1 to the initialization TFT T4 and the bypass TFT T7, the emission control signal line 123 delivers an emission control signal En to the driving control TFT T5 and the emission control TFT T6, the data line 171 crosses the scan line 121 to deliver a data signal Dm, the lower power supply line 172 delivers a driving voltage ELVDD and is substantially parallel to the data line 171, and the initialization voltage line 124 delivers an initialization voltage Vint for initializing the driving TFT T1.

A gate electrode G1 of the driving TFT T1 is connected to a first storage capacitive plate Cst1 of the storage capacitor Cst, a source electrode S1 of the driving TFT T1 is connected to the lower power supply line 172 via the driving control TFT T5, and a drain electrode D1 of the driving TFT T1 is electrically connected to a pixel electrode 191 (refer to FIG. 9) of the organic light-emitting device OLED via the emission control TFT T6. The driving TFT T1 receives the data signal Dm according to a switching operation by the switching TFT T2, and thus supplies driving current $I_D$ to the organic light-emitting device OLED.

A gate electrode G2 of the switching TFT T2 is connected to the scan line 121, a source electrode S2 of the switching TFT T2 is connected to the data line 171, and a drain electrode D2 of the switching TFT T2 is connected to the source electrode S1 of the driving TFT T1 and is connected to the lower power supply line 172 via the driving control TFT T5. The switching TFT T2 is turned on according to the scan signal Sn received via the scan line 121 and performs the switching operation to deliver the data signal Dm delivered via the data line 171 to the source electrode S1 of the driving TFT T1.

A gate electrode G3 of the compensation TFT T3 is connected to the scan line 121, a source electrode S3 of the compensation TFT T3 is connected to the drain electrode D1 of the driving TFT T1 and is connected to the pixel electrode 191 (refer to FIG. 9) of the organic light-emitting device OLED via the emission control TFT T6, and a drain electrode D3 of the compensation TFT T3 is connected to the first storage capacitive plate Cst1 of the storage capacitor Cst, a drain electrode D4 of the initialization TFT T4, and the gate electrode G1 of the driving TFT T1. The compensation TFT T3 is turned on according to the scan signal Sn received via the scan line 121 and diode-connects the driving TFT T1 by electrically connecting the gate electrode G1 and the drain electrode D1 of the driving TFT T1.

A gate electrode G4 of the initialization TFT T4 is connected to the previous scan line 122, a source electrode S4 of the initialization TFT T4 is connected to a drain electrode D7 of the bypass TFT T7 and the initialization voltage line 124, and the drain electrode D4 of the initialization TFT T4 is connected to the first storage capacitive plate Cst1 of the storage capacitor Cst, the drain electrode D3 of the compensation TFT T3, and the gate electrode G1 of the driving TFT T1. The initialization TFT T4 is turned on according to the previous scan signal Sn−1 received via the previous scan line 122 and delivers the initialization voltage Vint to the gate electrode G1 of the driving TFT T1 so as to perform an initialization operation for initializing a voltage of the gate electrode G1 of the driving TFT T1.

A gate electrode G5 of the driving control TFT T5 is connected to the emission control signal line 123, a source electrode S5 of the driving control TFT T5 is connected to the lower power supply line 172, and a drain electrode D5 of the driving control TFT T5 is connected to the source electrode S1 of the driving TFT T1 and the drain electrode D2 of the switching TFT T2.

A gate electrode G6 of the emission control TFT T6 is connected to the emission control signal line 123, a source electrode S6 of the emission control TFT T6 is connected to the drain electrode D1 of the driving TFT T1 and the source electrode S3 of the compensation TFT T3, and a drain electrode D6 of the emission control TFT T6 is electrically connected to a source electrode S7 of the bypass TFT T7 and the pixel electrode 191 of the organic light-emitting device OLED. The driving control TFT T5 and the emission control TFT T6 are substantially simultaneously turned on according to the emission control signal En received via the emission control signal line 123 so as to allow the driving current $I_D$ to flow to the organic light-emitting device OLED by applying the driving voltage ELVDD to the organic light-emitting device OLED.

A gate electrode G7 of the bypass TFT T7 is connected to the previous scan line 122, a source electrode S7 of the bypass TFT T7 is connected to the drain electrode D6 of the emission control TFT T6 and the pixel electrode 191 (refer to FIG. 9) of the organic light-emitting device OLED, and the drain electrode D7 of the bypass TFT T7 is connected to the source electrode S4 of the initialization TFT T4 and the initialization voltage line 124. The gate electrode G7 of the bypass TFT T7 receives the previous scan signal Sn−1 received via the previous scan line 122. When an electric signal having a predetermined voltage capable of turning off the bypass TFT T7 is applied from the previous scan signal Sn−1, the bypass TFT T7 is turned off and a portion of driving current $I_d$ flows as bypass current $I_{bp}$ via the bypass TFT T7.

When minimum current of the driving TFT T1 flows as driving current for displaying a black image, if the organic light-emitting device OLED emits light, the black image is not appropriately displayed. Here, the minimum current of the driving TFT T1 indicates current under a condition in which a gate-source voltage $V_{GS}$ of the driving TFT T1 is less than a threshold voltage $V_{th}$, such that the driving TFT T1 is turned off. Therefore, to prevent emission of the organic light-emitting device OLED when the minimum current flows as the driving current, the bypass TFT T7 may distribute, as the bypass current $I_{bp}$, the portion of the driving current $I_d$, which flows out of the driving TFT T1, to another current path except for a current path toward the organic light-emitting device OLED. In this manner, current smaller than minimum driving current (e.g., current about equal to or less than about 10 pA) under a condition of turning off the driving TFT T1 is delivered to the organic light-emitting device OLED, and while the organic light-emitting device OLED does not emit light or emits a small amount of light, the black image is displayed.

When the minimum driving current to display the black image flows, emission or non-emission or a level of the emission of the organic light-emitting device OLED may be significantly affected since the bypass current $I_{bp}$ is diverged from the minimum driving current. However, when large driving current to display a general image or a white image flows, the level of the emission of the organic light-emitting device OLED may not be affected, or may only be slightly affected by the bypass current $I_{bp}$. Therefore, emission current $T_{OLED}$ of the organic light-emitting device OLED, which is decreased by the bypass current $I_{bp}$ that is diverged from the driving current $I_d$ via the bypass TFT T7 when the driving current to display the black image flows, may have a level capable of accurately displaying the black image. Thus, by realizing an accurate black luminance image by using the bypass TFT T7, a contrast ratio may be improved.

Referring to FIG. 2, in an exemplary embodiment, the initialization TFT T4 and the bypass TFT T7 are connected to the previous scan line 122. However, the present disclosure is not limited thereto. For example, in an exemplary embodiment, the initialization TFT T4 may be connected to the previous scan line 122 and may be driven according to the previous scan signal Sn−1, and the bypass TFT T7 may be connected to a separate wire and may be driven according to a signal delivered via the wire.

A second storage capacitive plate Cst2 of the storage capacitor Cst is connected to the lower power supply line 172, and an opposite electrode of the organic light-emitting device OLED is connected to a common electrode ELVSS. Accordingly, the organic light-emitting device OLED may emit light by receiving a portion of the driving current $I_D$ from the driving TFT T1 and thus may display an image.

Referring to FIG. 2, in an exemplary embodiment, each of the compensation TFT T3 and the initialization TFT T4 has dual gate electrodes. However, the present disclosure is not limited thereto. For example, in an exemplary embodiment, each of the compensation TFT T3 and the initialization TFT T4 may have one gate electrode. Alternatively, exemplary embodiments of the present disclosure may be variously changed so that at least one of other TFTs T1, T2, T5, T6, and T7 other than the compensation TFT T3 and the initialization TFT T4 may have two gate electrodes.

Hereinafter, an operation of one pixel of the organic light-emitting display apparatus according to an exemplary embodiment of the present disclosure is described below.

First, during an initialization period, the previous scan signal Sn−1 having a low level is supplied via the previous scan line 122. Then, the initialization TFT T4 is turned on in response to the previous scan signal Sn−1 having the low level. Thus, the initialization voltage Vint from the initialization voltage line 124 is delivered to the gate electrode G1 of the driving TFT T1 via the initialization TFT T4. As a result, the driving TFT T1 is initialized due to the initialization voltage Vint.

Then, during a data programming period, a scan signal Sn having a low level is supplied via the scan line 121. Then, in response to the scan signal Sn having the low level, the switching TFT T2 and the compensation TFT T3 are turned on. Accordingly, the driving TFT T1 is diode-connected by the turned-on compensation TFT T3, and is biased in a forward direction. Then, a compensation voltage Dm+Vth (where Vth is a negative value) obtained by subtracting an absolute value of the threshold voltage Vth of the driving TFT T1 from the data signal Dm that is supplied via the data line 171 is applied to the gate electrode G1 of the driving TFT T1. Then, the driving voltage ELVDD and the compensation voltage Dm+Vth are applied to both terminals of the storage capacitor Cst, so that charges corresponding to a voltage difference between both terminals are stored in the storage capacitor Cst.

Then, during an emission period, an emission control signal En supplied from the emission control signal line 123 is changed from a high level to a low level. Then, during the emission period, the driving control TFT T5 and the emission control TFT T6 are turned on in response to the emission control signal En having the low level. Then, the driving current $I_D$ that is determined according to a difference between a voltage of the gate electrode G1 of the driving TFT T1 and a voltage of the driving voltage ELVDD is generated, and then the driving current $I_D$ is supplied to the organic light-emitting device OLED via the emission control TFT T6. During the emission period, a gate-source voltage $V_{GS}$ of the driving TFT T1 is maintained at '(Dm+Vth)-ELVDD' due to the storage capacitor Cst, and according to a current-voltage relation of the driving TFT T1, the driving current $I_D$ is proportional to '(Dm-ELVDD)' that is a square of a value obtained by subtracting the threshold voltage Vth from the gate-source voltage $V_{GS}$. Thus, according to exemplary embodiments, the driving current $I_D$ is determined regardless of the threshold voltage Vth of the driving TFT T1.

Hereinafter, a detailed structure of one subpixel of the organic light-emitting display apparatus illustrated in FIG. 2, according to an exemplary embodiment of the present disclosure, is described with reference to FIGS. 3 through 10.

Figure 3:
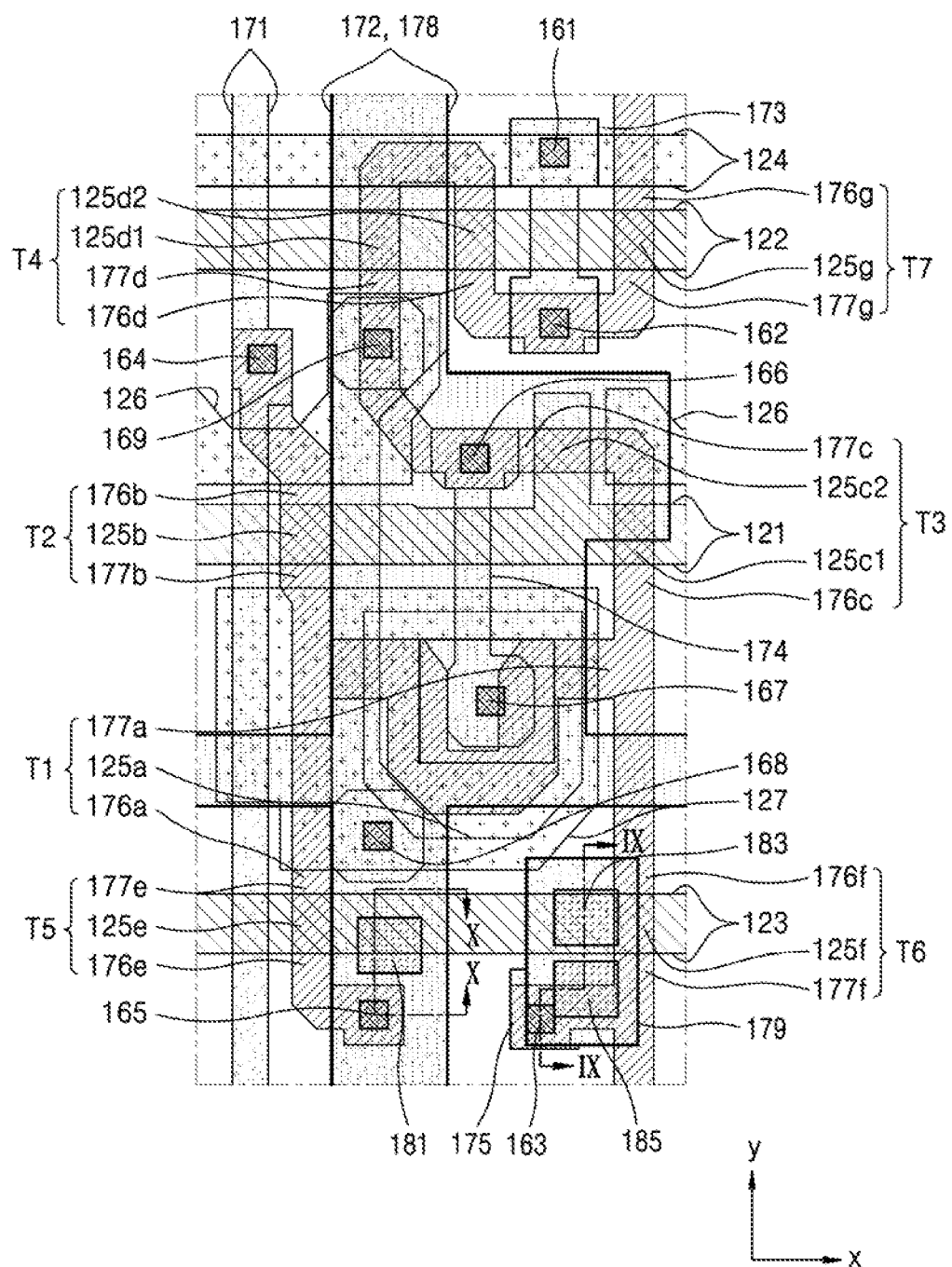
FIG. 3 is a layout view illustrating locations of a plurality of thin-film transistors (TFTs) and a capacitor in the subpixel of FIG. 2, according to an exemplary embodiment of the present disclosure.

FIG. 3 is a layout view illustrating locations of a plurality of TFTs and a capacitor in the subpixel of FIG. 2, according to an exemplary embodiment of the present disclosure. The layout view of FIG. 3 illustrates an arrangement of one subpixel. According to exemplary embodiments, a plurality of subpixels, each having an identical or similar configuration, may be arranged adjacent to the one subpixel in horizontal and vertical directions (e.g., arranged in a matrix configuration). FIGS. 4 through 8 are layout views of layers, each having elements such as the plurality of TFTs, the capacitor, etc., of FIG. 3. Each of FIGS. 4 through 8 illustrates exemplary embodiments in which wires of a same layer or an arrangement of a semiconductor layer, and an insulating layer, may be interposed between layer structures. For example, a first gate insulating layer 141 (refer to FIG. 9) may be interposed between a layer of FIG. 4 and a layer of FIG. 5, a second gate insulating layer 142 (refer to FIG. 9) may be interposed between the layer of FIG. 5 and a layer of FIG. 6, and a first inorganic layer 151 (refer to FIG. 9) may be interposed between a layer of FIG. 7 and a layer of FIG. 8. Contact holes may be formed in the aforementioned insulating layers, so that the layer structures illustrated in FIGS. 4 through 8 may be electrically connected to one another in a substantially vertical direction. In this manner, the display apparatus according to an exemplary embodiment has a circuit unit that is arranged in the display area DA and that includes conductive layers. The circuit unit may also be referred to herein as a circuit. The pixel electrode 191 is arranged over (e.g., disposed on) the circuit unit, and is electrically connected to at least one of the conductive layers of the circuit unit.

The subpixel of the organic light-emitting display apparatus according to an exemplary embodiment includes the scan line 121, the previous scan line 122, the emission control signal line 123, and the initialization voltage line 124 that are arranged along a row direction and that respectively apply the scan signal Sn, the previous scan signal Sn−1, the emission control signal En, and the initialization voltage Vint to the subpixel. The subpixel of the display apparatus according to an exemplary embodiment may include the data line 171, and the power supply lines 172 and 178 which cross the scan line 121, the previous scan line 122, the emission control signal line 123, and the initialization voltage line 124 that respectively apply the data signal Dm and the driving voltage ELVDD to the subpixel.

In addition, the subpixel may include the driving TFT T1, the switching TFT T2, the compensation TFT T3, the initialization TFT T4, the driving control TFT T5, the emission control TFT T6, the bypass TFT T7, the storage capacitor Cst, and an organic light-emitting device.

Figure 4:
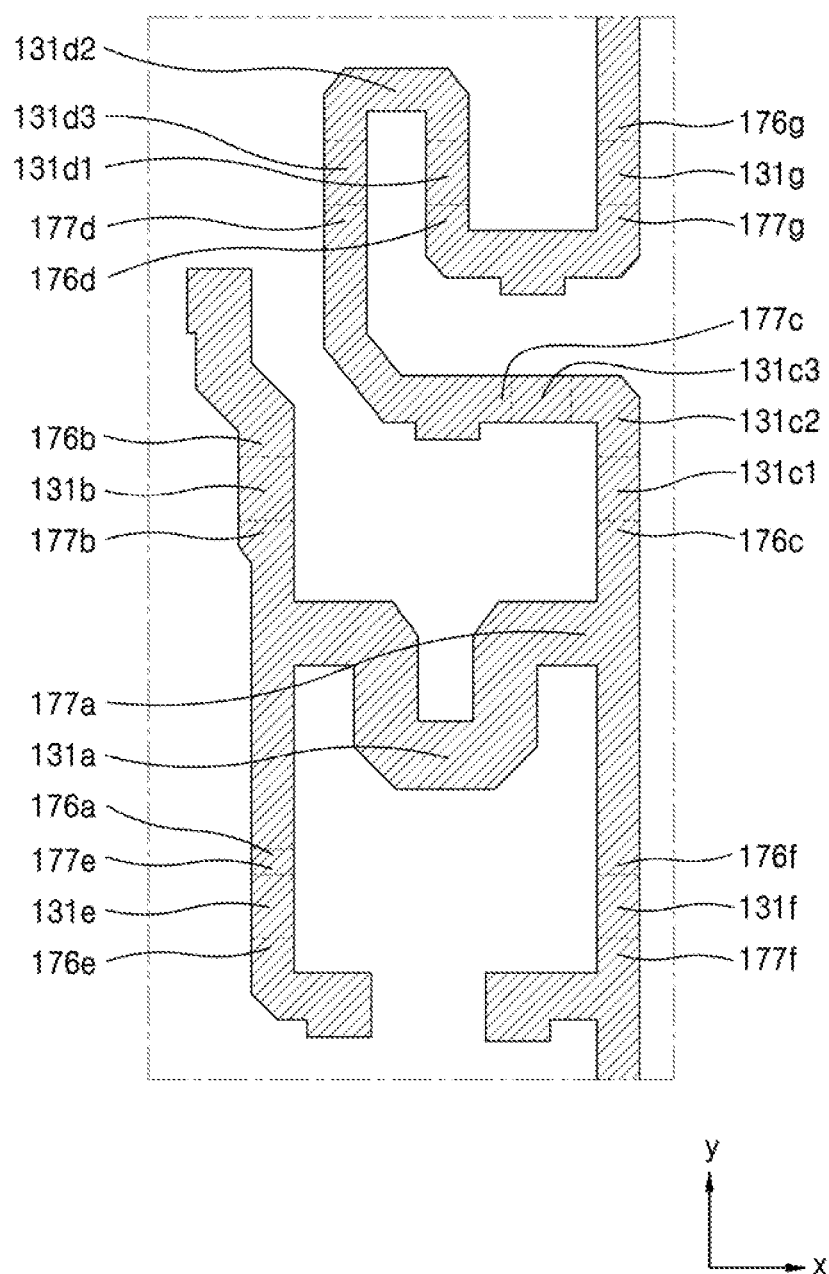
FIGS. 4 through 8 are layout views of layers of FIG. 3, according to an exemplary embodiment of the present disclosure.

The driving TFT T1, the switching TFT T2, the compensation TFT T3, the initialization TFT T4, the driving control TFT T5, the emission control TFT T6, and the bypass TFT T7 may be formed along a semiconductor layer as illustrated in FIG. 4. The semiconductor layer may have a shape that is curved in various directions. The semiconductor layer may include a driving channel region 131a corresponding to the driving TFT T1, a switching channel region 131b corresponding to the switching TFT T2, compensation channel regions 131c1, 131c2, and 131c3 corresponding to the compensation TFT T3, initialization channel regions 131d1, 131d2, and 131d3 corresponding to the initialization TFT T4, an operation control channel region 131e corresponding to the driving control TFT T5, an emission control channel region 131f corresponding to the emission control TFT T6, and a bypass channel region 131g corresponding to the bypass TFT T7. That is, according to exemplary embodiments of the present disclosure, the driving channel region 131a, the switching channel region 131b, the compensation channel regions 131c1, 131c2, and 131c3, the initialization channel regions 131d1, 131d2, and 131d3, the operation control channel region 131e, the emission control channel region 131f, and the bypass channel region 131g may be some regions of the semiconductor layer as illustrated in FIG. 4.

The semiconductor layer may include, for example, polysilicon. Further, the semiconductor layer may include the aforementioned channel regions that are not doped with impurity, and source and drain regions that are disposed on both sides of the channel regions and that are doped with impurity. The impurity type may vary according to types of a TFT, and may include, for example, an N-type impurity or a P-type impurity. The channel region, the source region at one side of the channel region, and the drain region at the other side of the channel region may be referred to collectively as an active layer. That is, the TFT may have an active layer that includes the channel region, the source region, and the drain region.

The doped source region or the doped drain region may correspond to a source electrode or drain electrode of the TFT. For example, a driving source electrode may correspond to a driving source region 176a doped with impurity in a periphery of a driving channel region 131a of the semiconductor layer as illustrated in FIG. 4, and a driving drain electrode may correspond to a driving drain region 177a doped with impurity in a periphery of the driving channel region 131a of the semiconductor layer as illustrated in FIG. 4. Hereinafter, for convenience of description, terms such as a source region and a drain region may be used instead of a source electrode and a drain electrode. In addition, portions of the semiconductor layer as illustrated in FIG. 4 between the TFTs may correspond to wires that are doped with impurity and thus function to electrically connect the TFTs. This characteristic is also applied to exemplary embodiments, including modified exemplary embodiments thereof, that are described below.

The storage capacitor Cst may include a first storage capacitive plate 125a and a second storage capacitive plate 127 that are placed having the second gate insulating layer 142 interposed therebetween. Here, the first storage capacitive plate 125a may also function as a driving gate electrode 125a of the driving TFT T1. That is, the driving gate electrode 125a and the first storage capacitive plate 125a may be one body. Hereinafter, for convenience of description, when a driving gate electrode is referred to, a reference numeral of the driving gate electrode may be the same as that of the first storage capacitive plate 125a.

Figure 5:
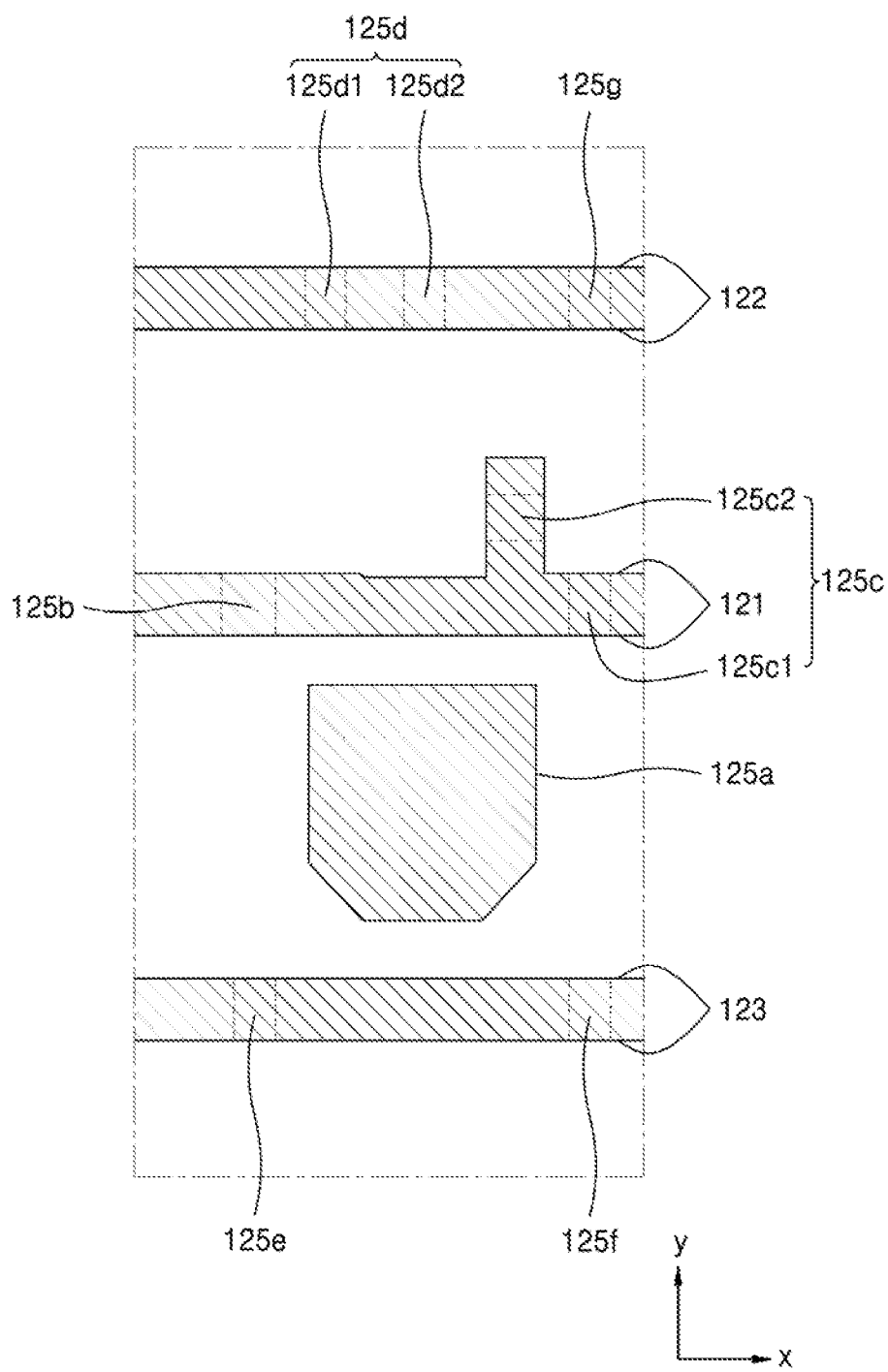

As illustrated in FIG. 5, the first storage capacitive plate 125a may have an island form that is spaced apart from an adjacent subpixel. As illustrated in FIG. 5, in an exemplary embodiment, the first storage capacitive plate 125a may be formed from the same material layer as the scan line 121, the previous scan line 122, and the emission control signal line 123.

A switching gate electrode 125b and compensation gate electrodes 125c1 and 125c2 may be portions of the scan line 121 or protrusions from the scan line 121 that cross the semiconductor layer. Initialization gate electrodes 125d1 and 125d2 and a bypass gate electrode 125g may be portions of the previous scan line 122 or protrusions from the previous scan line 122 that cross the semiconductor layer. An operation control gate electrode 125e and an emission control gate electrode 125f may be portions of the emission control signal line 123 or protrusions from the emission control signal line 123 that crosses the semiconductor layer.

Figure 6:
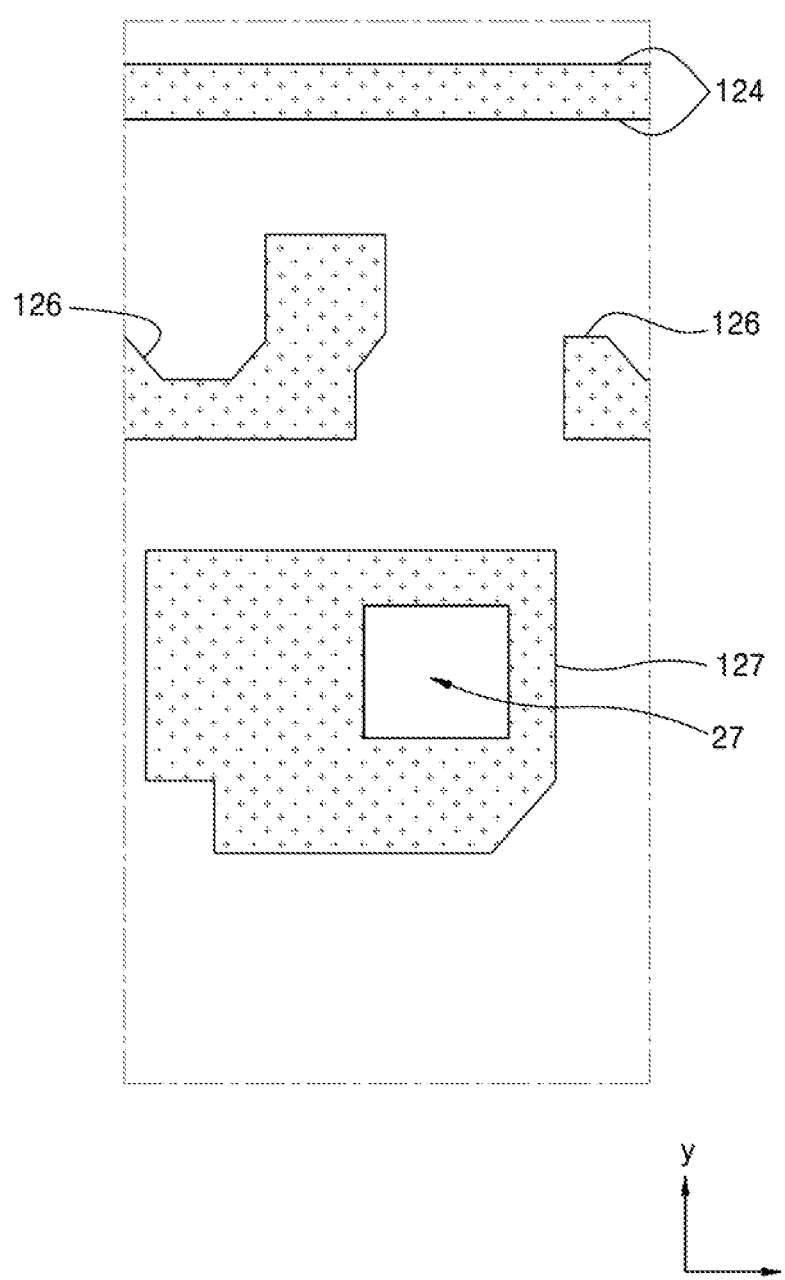

The second storage capacitive plate 127 may extend over adjacent subpixels such that the second storage capacitive plates 127 in adjacent subpixels are formed integrally. As illustrated in FIG. 6, the second storage capacitive plate 127 may be formed from the same material layer as the initialization voltage line 124 and/or a shield layer 126. A storage opening 27 may be formed in the second storage capacitive plate 127. As a result, the first storage capacitive plate 125a and a compensation drain region 177c of the compensation TFT T3 may be electrically connected to each other using a connection member 174, which is described below, via the storage opening 27. The second storage capacitive plate 127 may be connected to the lower power supply line 172 via a contact hole 168 formed in an interlayer insulating layer 143 (refer to FIG. 9).

The driving TFT T1 includes the driving channel region 131a, the driving gate electrode 125a, the driving source region 176a, and the driving drain region 177a. As described above, the driving gate electrode 125a may also function as the first storage capacitive plate 125a. The driving source region 176a indicates a portion outside the driving gate electrode 125a (in a −x direction in FIG. 4), and the driving drain region 177a indicates a portion outside the driving gate electrode 125a (in a +x direction in FIG. 4) and is placed at an opposite side of the driving source region 176a by having the driving gate electrode 125a arranged therebetween.

The driving source region 176a of the driving TFT T1 is connected to a switching drain region 177b and an operation control drain region 177e, which is described below. The driving drain region 177a is connected to a compensation source region 176c and an emission control source region 176f, which is described below.

The switching TFT T2 includes the switching channel region 131b, the switching gate electrode 125b, a switching source region 176b, and the switching drain region 177b. The switching source region 176b may be electrically connected to the data line 171 via a contact hole 164 formed in the first gate insulating layer 141, the second gate insulating layer 142, and the interlayer insulating layer 143. According to exemplary embodiments, a periphery of the contact hole 164 of the data line 171 may be a source region of the switching TFT T2. The switching drain region 177b indicates a portion of the semiconductor layer that is doped with impurity and that is placed at an opposite side of the switching source region 176b by having the switching channel region 131b arranged therebetween.

The switching TFT T2 is used as a switching device configured to select an emission target subpixel. The switching gate electrode 125b is connected to the scan line 121, the switching source region 176b is connected to the data line 171 as described above, and the switching drain region 177b is connected to the driving TFT T1 and the driving control TFT T5.

The compensation TFT T3 includes the compensation channel regions 131c1, 131c2, and 131c3, the compensation gate electrodes 125c1 and 125c2, the compensation source region 176c, and the compensation drain region 177c. The compensation source region 176c is a portion of the semiconductor layer that is doped with impurity and disposed outside the compensation channel regions 131c1, 131c2, and 131c3. The compensation drain region 177c is disposed outside the compensation channel regions 131c1, 131c2, and 131c3 and is doped with impurity. The compensation gate electrodes 125c1 and 125c2 are dual gate electrodes including the first gate electrode 125c1 and the second gate electrode 125c2, and may be arranged to prevent or decrease an occurrence of leakage current. The compensation drain region 177c of the compensation TFT T3 may be connected to the first storage capacitive plate 125a via the connection member 174. The compensation channel regions 131c1, 131c2, and 131c3 may include the portion 131c1 corresponding to the first gate electrode 125c1, the portion 131c3 corresponding to the second gate electrode 125c2, and the portion 131c2 between the portions 131c1 and 131c3.

Figure 7:
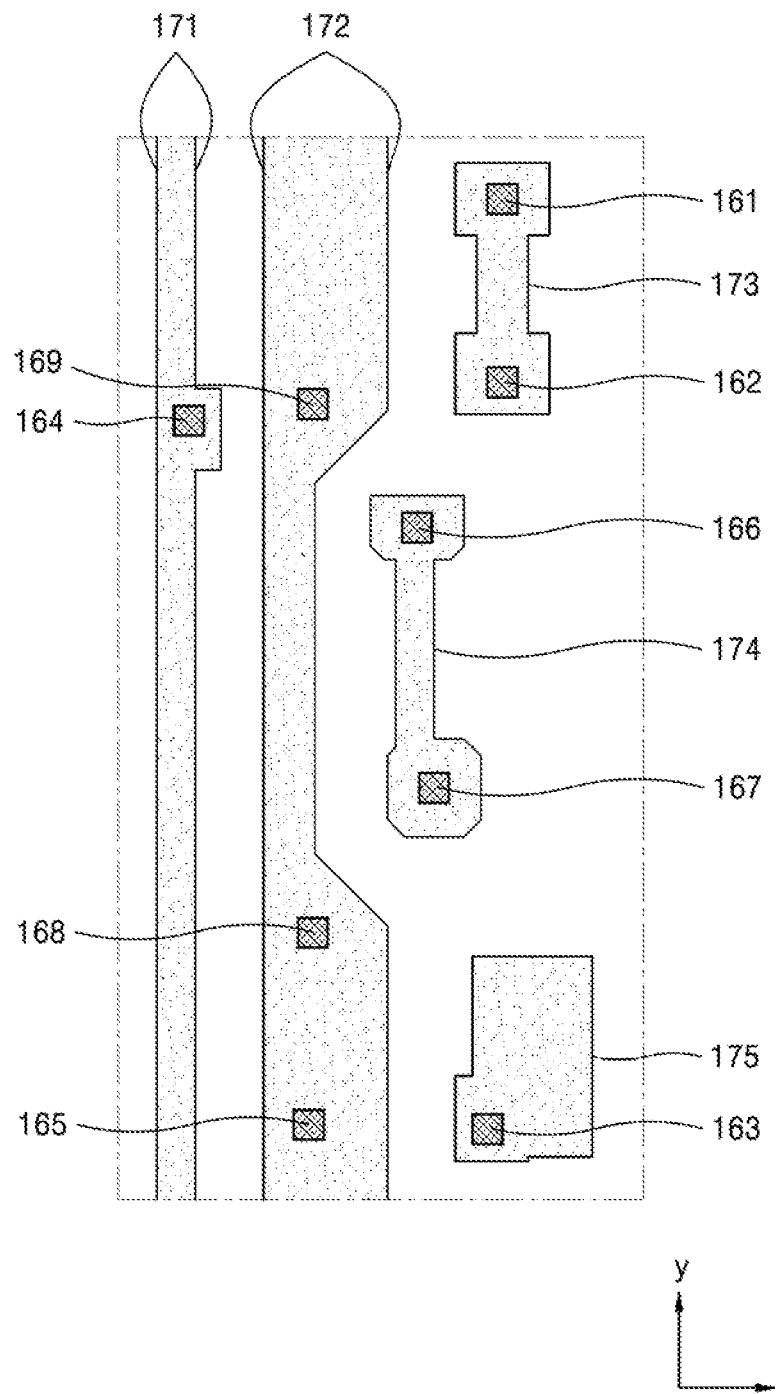

The connection member 174 may be formed from the same material layer as the data line 171 as illustrated in FIG. 7. An end of the connection member 174 is connected to the compensation drain region 177c and an initialization drain region 177d via a contact hole 166 formed in the first gate insulating layer 141, the second gate insulating layer 142, and the interlayer insulating layer 143. The other end of the connection member 174 is connected to the first storage capacitive plate 125a via a contact hole 167 formed in the second gate insulating layer 142 and the interlayer insulating layer 143. In this regard, the other end of the connection member 174 is connected to the first storage capacitive plate 125a via the storage opening 27 formed in the second storage capacitive plate 127.

The initialization TFT T4 includes initialization channel regions 131d1, 131d2, and 131d3, an initialization gate electrode 125d, an initialization source region 176d, and the initialization drain region 177d. The initialization source region 176d is connected to the initialization voltage line 124 via an initialization connection line 173. An end of the initialization connection line 173 may be connected to the initialization voltage line 124 via a contact hole 161 formed in the second gate insulating layer 142 and the interlayer insulating layer 143, and the other end of the initialization connection line 173 may be connected to the initialization source region 176d via a contact hole 162 formed in the first gate insulating layer 141, the second gate insulating layer 142, and the interlayer insulating layer 143. The initialization drain region 177d indicates a portion of the semiconductor layer that is doped with impurity and that is placed at an opposite side of the initialization source region 176d by having the initialization channel regions 131d1, 131d2, and 131d3 arranged therebetween.

The driving control TFT T5 includes the operation control channel region 131e, the operation control gate electrode 125e, an operation control source region 176e, and the operation control drain region 177e. The operation control source region 176e may be electrically connected to the lower power supply line 172 via a contact hole 165 formed in the first gate insulating layer 141, the second gate insulating layer 142, and the interlayer insulating layer 143. According to exemplary embodiments, a periphery of the contact hole 165 of the lower power supply line 172 may be a source region of the driving control TFT T5. The operation control drain region 177e indicates a portion of the semiconductor layer that is doped with impurity and that is placed at an opposite side of the operation control source region 176e by having the operation control channel region 131e arranged therebetween.

The emission control TFT T6 includes the emission control channel region 131f, the emission control gate electrode 125f, the emission control source region 176f, and an emission control drain region 177f. The emission control drain region 177f may be connected to a middle connection layer 175 over the interlayer insulating layer 143 via a contact hole 163 formed in the first gate insulating layer 141, the second gate insulating layer 142, and the interlayer insulating layer 143. As illustrated in FIG. 7, the middle connection layer 175, the data line 171, and the lower power supply line 172 may be placed over the interlayer insulating layer 143. The emission control source region 176f indicates a portion of the semiconductor layer that is doped with impurity and that is placed at an opposite side of the emission control drain region 177f by having the emission control channel region 131*f* arranged therebetween. The middle connection layer 175 may be electrically connected to an auxiliary connection layer 179, which is described below, and thus, may be electrically connected to the pixel electrode 191 of the organic light-emitting device.

The bypass TFT T7 includes the bypass channel region 131*g*, the bypass gate electrode 125*g*, a bypass source region 176*g*, and a bypass drain region 177*g*. Since the bypass drain region 177*g* is connected to the initialization source region 176*d* of the initialization TFT T4, the bypass drain region 177*g* is connected to the initialization voltage line 124 via the initialization connection line 173. The bypass source region 176*g* is electrically connected to a pixel electrode of an organic light-emitting device of a subpixel (in a +y direction). For example, the bypass source region 176*g* is connected to the emission control drain region 177*f* of the subpixel (in the +y direction) so that the bypass source region 176*g* may be connected to the middle connection layer 175 over the interlayer insulating layer 143 via the contact hole 163. As described above, the middle connection layer 175 is electrically connected to the auxiliary connection layer 179, and thus, is electrically connected to the pixel electrode 191 of the organic light-emitting device.

As described above, the shield layer 126 may be formed from the same material layer as the second storage capacitive plate 127 and the initialization voltage line 124. The shield layer 126 at a left side of FIG. 6 is arranged as one body extending over a corresponding subpixel and an adjacent subpixel (in a −x direction), and the shield layer 126 at a right side of FIG. 6 is arranged as one body extending over the corresponding subpixel and an adjacent subpixel (in a +x direction). The shield layer 126 overlaps with at least the portion 131*c*2 between the portions 131*c*1 and 131*c*3 from among the compensation channel regions 131*c*1, 131*c*2, and 131*c*3. Since the shield layer 126 is electrically connected to the lower power supply line 172 via a contact hole 169 formed in the interlayer insulating layer 143, an electric potential of the shield layer 126 is about constant.

The data line 171 is present in a subpixel near the subpixel (e.g., in a +x direction) as illustrated in FIG. 3. For convenience of description, when the subpixel as illustrated in FIG. 3 is referred to as a pixel P1, and the subpixel near the pixel P1 (e.g., in the +x direction) is referred to as a pixel P2, the data line 171 delivers a data signal to the pixel P2 as well as to a plurality of subpixels arranged in +y and −y directions of the pixel P2. In this regard, the delivered data signal may vary according to luminance to be realized in each of the plurality of subpixels arranged in the +y and −y directions of the pixel P2. Accordingly, while the pixel P1 emits light, the data line 171 of the pixel P2 near the portion 131*c*2 of the semiconductor layer of the pixel P1 delivers different electric signals over time.

If the shield layer 126 is not present, parasitic capacitance may be generated between the data line 171 of the pixel P2 and the portion 131*c*2 from among the compensation channel regions 131*c*1, 131*c*2, and 131*c*3 of the pixel P1. Thus, during emission of the pixel P1 over time, an electric potential of the portion 131*c*2 of the compensation TFT T3 of the pixel P1 is affected by different electric signals delivered by the data line 171 of the pixel P2. The compensation TFT T3 is electrically connected to the driving TFT T1. Thus, if the electric potential of the portion 131*c*2 of the compensation TFT T3 of the pixel P1 is affected by different electric signals delivered by the data line 171 of the pixel P2, luminance of the organic light-emitting device, whose luminance is determined by the driving TFT T1, may become different from an original level, resulting in deterioration in quality of an image displayed by an organic light-emitting display apparatus.

However, in the organic light-emitting display apparatus according to an exemplary embodiment of the present disclosure, the shield layer 126 is disposed between the portion 131*c*2 of the compensation TFT T3 of the pixel P1 and the data line 171 of the pixel P2. Thus, the effect that the data line 171 of the pixel P2 has on the portion 131*c*2 of the compensation TFT T3 is eliminated or reduced compared to a comparative example in which the shield layer 126 is not present, resulting in an organic light-emitting display apparatus capable of displaying a high quality image with improved luminance (e.g., luminance having improved accuracy relative to the original level).

For example, in exemplary embodiments, since the shield layer 126 is electrically connected to the lower power supply line 172 via the contact hole 169 formed in the interlayer insulating layer 143, the electric potential of the shield layer 126 is about constant. As a result, the effect on the portion 131*c*2 of the compensation TFT T3 caused by an electric signal near the portion 131*c*2 may be eliminated or reduced.

As illustrated in FIG. 7, the data line 171, the lower power supply line 172, the initialization connection line 173, the connection member 174, and the middle connection layer 175 may include a same material and may be placed on a same layer (e.g., the interlayer insulating layer 143). The lower power supply line 172 supplies a constant electric signal to a plurality of subpixels. Preventing an occurrence of a voltage drop in the lower power supply line 172 allows for the realization of a display apparatus that displays a high quality image. However, as illustrated in FIG. 7, in exemplary embodiments, since the lower power supply line 172, the data line 171, the initialization connection line 173, the connection member 174, and the middle connection layer 175 are placed on the same layer, there is a limit in enlarging its area.

Figure 8:
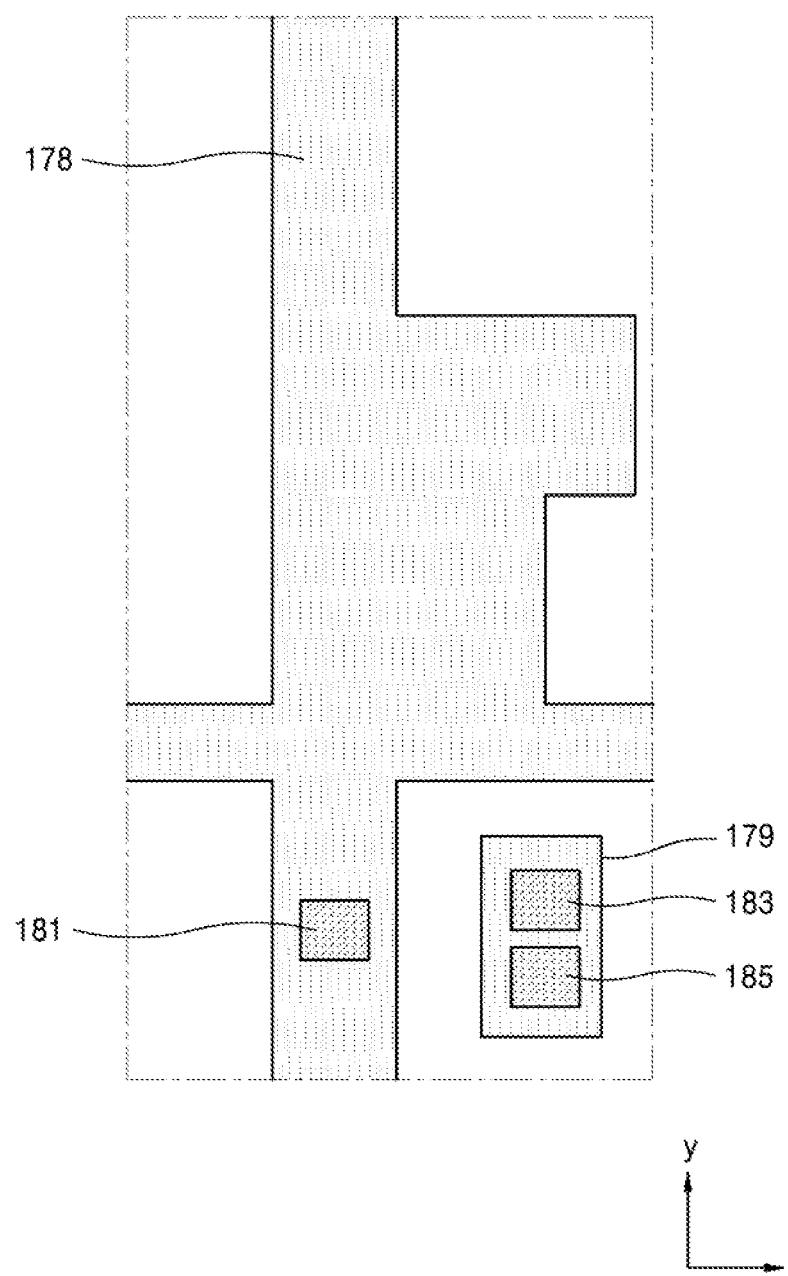

Therefore, in an exemplary embodiment, as shown in FIG. 8, to account for the voltage drop in the lower power supply line 172, the upper power supply line 178 is placed above the data line 171, the lower power supply line 172, the initialization connection line 173, the connection member 174, and the middle connection layer 175, and is electrically connected to the lower power supply line 172 via a contact hole 181. As illustrated in FIG. 8, in an exemplary embodiment, the upper power supply line 178 may have a "+" shape in a subpixel, and thus, in a larger portion (e.g., an entire portion) of the display area DA, the upper power supply line 178 may have a lattice shape. However, exemplary embodiments of the present disclosure are not limited thereto.

In addition, to electrically connect the emission control drain region 177*f* to the pixel electrode 191 of the organic light-emitting device, the auxiliary connection layer 179 including a same material as the upper power supply line 178 may be placed on a same layer as the upper power supply line 178, and may be electrically connected, via a contact hole 183, to the middle connection layer 175 that is electrically connected to the emission control drain region 177*f* via the contact hole 163. By electrically connecting the auxiliary connection layer 179 with the pixel electrode 191 of the organic light-emitting device via a contact hole 185 formed in an upper layer, the auxiliary connection layer 179 may allow the emission control drain region 177*f* to be electrically connected with the pixel electrode 191 of the organic light-emitting device.

Figure 9:
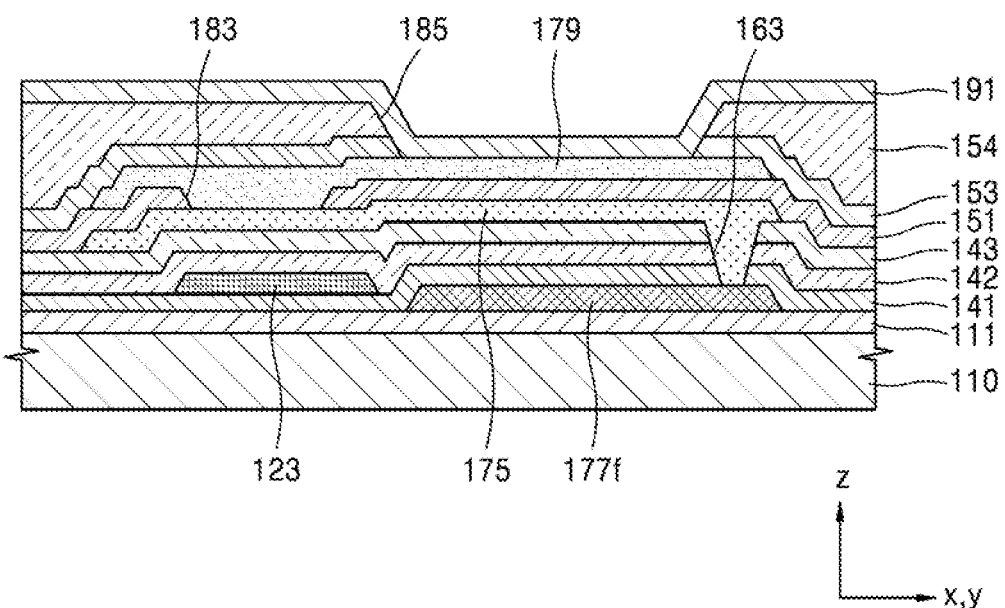
FIG. 9 is a cross-sectional view of a portion of the subpixel taken along line IX-IX of FIG. 3, according to an exemplary embodiment of the present disclosure.
Figure 10:
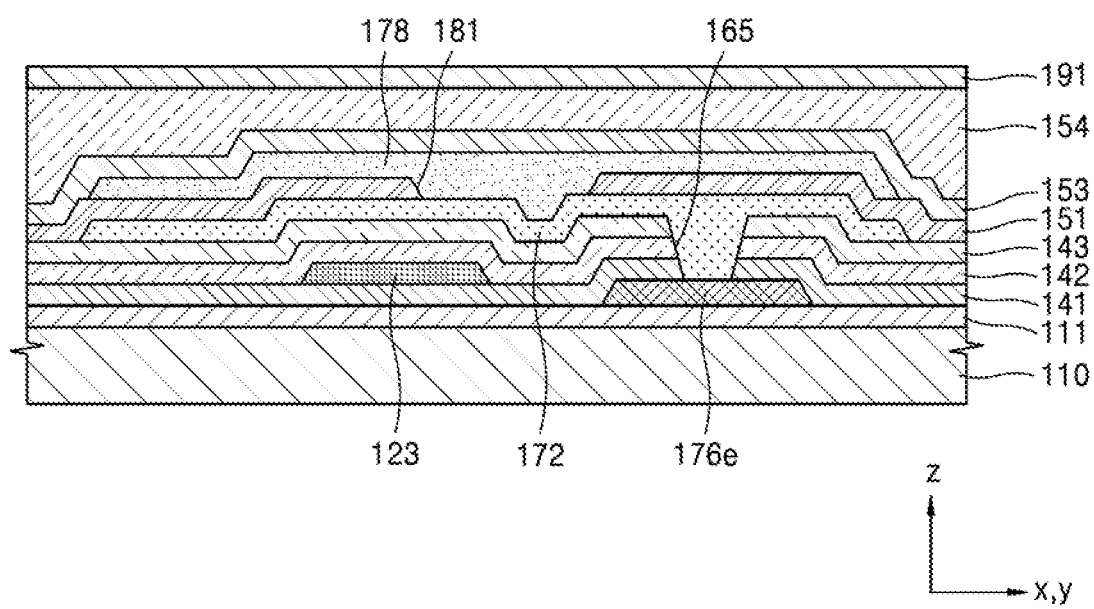
FIG. 10 is a cross-sectional view of a portion of the subpixel taken along line X-X of FIG. 3, according to an exemplary embodiment of the present disclosure.

FIG. 9 is a cross-sectional view of a portion of the subpixel taken along line IX-IX of FIG. 3 according to an exemplary embodiment of the present disclosure. FIG. 10 is a cross-sectional view of a portion of the subpixel taken along line X-X of FIG. 3. As illustrated in FIGS. 9 and 10, the aforementioned various elements may be placed over the substrate 110. The substrate 110 may include various materials such as, for example, a glass material, a metal material, a plastic material, etc. In exemplary embodiments, a buffer layer 111 may be placed over the substrate 110. The buffer layer 111 may planarize a surface of the substrate 110, and/or may prevent impurities from penetrating into the semiconductor layer thereon. The buffer layer 111 may have a single-layered structure or a multilayered structure including, for example, silicon oxide, silicon nitride, and/or silicon oxynitride.

The driving channel region 131*a*, the switching channel region 131*b*, the compensation channel regions 131*c*1, 131*c*2, and 131*c*3, etc., as illustrated in FIG. 4, may be arranged over the buffer layer 111. The first gate insulating layer 141 including, for example, silicon nitride, silicon oxide, and/or silicon oxynitride, may be arranged over the driving channel region 131*a*, the switching channel region 131*b*, the compensation channel regions 131*c*1, 131*c*2, and 131*c*3, etc.

Wires such as the driving gate electrode 125*a*, the scan line 121, the switching gate electrode 125*b*, the compensation gate electrode 125*c*, the previous scan line 122 including the initialization gate electrode 125*d* and the bypass gate electrode 125*g*, the emission control signal line 123 including the operation control gate electrode 125*e* and the emission control gate electrode 125*f*, etc., as illustrated in FIG. 5, may be arranged over the first gate insulating layer 141. The driving gate electrode 125*a*, the scan line 121, the previous scan line 122, and the emission control signal line 123 may be collectively referred to as first gate wiring.

The second gate insulating layer 142 may cover the first gate wiring. The second gate insulating layer 142 may include, for example, silicon nitride, silicon oxide, or silicon oxynitride. The second storage capacitive plate 127, the shield layer 126, and the initialization voltage line 124, as illustrated in FIG. 6, may be arranged over the second gate insulating layer 142. The second storage capacitive plate 127, the shield layer 126, and the initialization voltage line 124 may be collectively referred to as second gate wiring.

The interlayer insulating layer 143 is arranged over the second gate wiring. The interlayer insulating layer 143 may include, for example, silicon nitride, silicon oxide, or silicon oxynitride.

The data line 171, the lower power supply line 172, the initialization connection line 173, the connection member 174, and the middle connection layer 175, as illustrated in FIG. 7, may be arranged over the interlayer insulating layer 143. The data line 171, the lower power supply line 172, the initialization connection line 173, the connection member 174, and the middle connection layer 175 may be collectively referred to as a first conductive layer. The data line 171, the lower power supply line 172, the initialization connection line 173, the connection member 174, and the middle connection layer 175 may be electrically connected to the semiconductor layer below via the contact holes 161, 162, 163, 164, 165, 166, 167, 168, and 169 formed in at least portions of the first gate insulating layer 141, the second gate insulating layer 142, and the interlayer insulating layer 143, as described above.

The first inorganic layer 151 is placed over the first conductive layer. The first inorganic layer 151 may include, for example, silicon nitride, silicon oxide, or silicon oxynitride.

The upper power supply line 178 and the auxiliary connection layer 179, as illustrated in FIG. 8, may be arranged over the first inorganic layer 151. The upper power supply line 178 and the auxiliary connection layer 179 may be collectively referred to as a second conductive layer. The upper power supply line 178 and the auxiliary connection layer 179 may be electrically connected to the first conductive layer via the contact holes 181 and 183 formed in the first inorganic layer 151. For example, as illustrated in FIG. 10, in an exemplary embodiment, the first inorganic layer 151 has an additional opening for the contact hole 181, and thus exposes at least a portion of a first top surface of the lower power supply line 172 under the first inorganic layer 151. As a result, the upper power supply line 178 may contact the lower power supply line 172 via the additional opening. The first inorganic layer 151 has a first opening for the contact hole 183, as illustrated in FIG. 9, allowing the auxiliary connection layer 179 above to contact the middle connection layer 175.

As described above, the middle connection layer 175 that is a portion of the first conductive layer may be connected to the semiconductor layer below, for example, the emission control drain region 177*f*, via the contact hole 163 formed in at least portions of the first gate insulating layer 141, the second gate insulating layer 142, and the interlayer insulating layer 143. Therefore, the auxiliary connection layer 179 of the second conductive layer, which is electrically connected to the middle connection layer 175 via the contact hole 183, may also be electrically connected to the semiconductor layer below, for example, the emission control drain region 177*f*. However, the present disclosure is not limited thereto. For example, according to an exemplary embodiment, in a display apparatus having an equivalent circuit diagram different from that of FIG. 2, the second conductive layer may be electrically connected to various source regions or drain regions of the semiconductor layer. This characteristic is also applied to exemplary embodiments and modified exemplary embodiments thereof to be described below.

A second inorganic layer 153 is placed over the second conductive layer. The second inorganic layer 153 may include, for example, silicon nitride, silicon oxide, or silicon oxynitride. The second inorganic layer 153 covers the second conductive layer and contacts the first inorganic layer 151 outside the second conductive layer. Referring to FIG. 9, the second inorganic layer 153 covers the auxiliary connection layer 179, and thus contacts the first inorganic layer 151 outside the auxiliary connection layer 179. Referring to FIG. 10, the second inorganic layer 153 covers the upper power supply line 178, and thus contacts the first inorganic layer 151 outside the upper power supply line 178.

A planarization layer 154 may be arranged over the second inorganic layer 153, and the pixel electrode 191 of the organic light-emitting device may be placed over the planarization layer 154. The pixel electrode 191 may be connected to the auxiliary connection layer 179 via a second opening formed in the second inorganic layer 153 and the contact hole 185 corresponding to the second opening and formed in the planarization layer 154, so that the pixel electrode 191 may be electrically connected to the emission control drain region 177*f*.

Referring to FIG. 9, in an exemplary embodiment, an inner surface of the second opening formed in the second inorganic layer 153 is about equal to an inner surface of the contact hole 185 formed in the planarization layer 154. Thus, the second opening formed in the second inorganic layer 153 and the contact hole 185 formed in the planarization layer 154 may be collectively referred to as the contact hole 185. However, the present disclosure is not limited thereto. For example, in an exemplary embodiment, the inner surface of the second opening formed in the second inorganic layer 153 may not be about equal to the inner surface of the contact hole 185 formed in the planarization layer 154. For example, an area of the second opening formed in the second inorganic layer 153 may be greater than an area of the contact hole 185 formed in the planarization layer 154. The planarization layer 154 may include an organic material such as, for example, acryl, benzocyclobutene (BCB), polyimide, hexamethyldisiloxane (HMDSO), etc.

In the display apparatus according to an exemplary embodiment, each of the conductive layers included in the circuit unit in the display area DA is placed to contact a corresponding inorganic layer arranged below the corresponding conductive layer (e.g., directly below the corresponding conductive layer). For example, in exemplary embodiments, there are no intervening layers present between each conductive layer and its corresponding inorganic layer, and each conductive layer contacts (e.g., directly contacts) a corresponding inorganic layer disposed directly below the corresponding conductive layer (e.g., each conductive layer is disposed directly above its corresponding inorganic layer with no intervening layers present). For example, as described above, the first gate wiring including the driving gate electrode 125a, the scan line 121, the previous scan line 122, and the emission control signal line 123, as illustrated in FIG. 5, are placed on the first gate insulating layer 141. Further, the second gate wiring including the second storage capacitive plate 127, the shield layer 126, and the initialization voltage line 124, as illustrated in FIG. 6, are placed on the second gate insulating layer 142. Further, the first conductive layer including the data line 171, the lower power supply line 172, the initialization connection line 173, the connection member 174, and the middle connection layer 175, as illustrated in FIG. 7, are placed on the interlayer insulating layer 143. Further, the second conductive layer including the upper power supply line 178 and the auxiliary connection layer 179, as illustrated in FIG. 8, are placed on the first inorganic layer 151. In this regard, the first gate insulating layer 141, the second gate insulating layer 142, the interlayer insulating layer 143, and the first inorganic layer 151 may be inorganic layers.

When wires are variously patterned, a conductive layer is arranged over a surface (e.g., an entire surface) of the substrate 110, is patterned, and then is partially removed. If portions targeted for removal are not properly removed, elements that are not supposed to be electrically connected to each other may be connected, causing an occurrence of a short. As a result, a defect may occur in the display apparatus.

When the conductive layer is formed on an organic layer, is patterned, and then is partially removed, portions targeted for removal may not be properly removed. For example, if the conductive layer includes titanium, the titanium may react with an organic material below the conductive layer causing a titanium oxide layer to be formed on an interface between the conductive layer and the organic layer. For example, during a patterning process, a portion of the conductive layer targeted for removal that includes titanium may be removed, but the titanium oxide layer below may not be removed, and may remain after the patterning process. As a result, elements that are not supposed to be electrically connected to each other may be connected, causing an occurrence of a short. As a result, a defect may occur in the display apparatus.

For example, since the number of electronic devices such as a TFT included in each subpixel is increased to embody a display apparatus that displays a high quality image, or an area of each subpixel is decreased to embody a high-resolution display apparatus, a gap between various types of wires in the display area DA may become smaller than a gap between wires in a display area of a display apparatus according to a comparative example. In this case, a defect rate due to the remaining titanium oxide layer may be sharply increased.

However, in the display apparatus according to an exemplary embodiment, as described above, the conductive layers in the display area DA are arranged to contact the inorganic layers provided below (e.g., directly below) the conductive layers, respectively. For example, in an exemplary embodiment, a bottom surface of each of the conductive layers is placed so as to make surface-to-surface contact with the inorganic layer arranged below (e.g., directly below) the corresponding bottom surface. That is, in an exemplary embodiment, a bottom surface of each of the conductive layers is placed so as to directly contact its corresponding inorganic layer (e.g., a bottom surface of each conductive layer directly contacts a top surface of its corresponding inorganic layer disposed below the conductive layer). Therefore, in exemplary embodiments, defects that may occur during a process of patterning the conductive layers may be prevented or reduced.

As described above, the second inorganic layer 153 over the second conductive layer covers the second conductive layer and contacts the first inorganic layer 151 in the periphery of the second conductive layer. Referring to FIG. 9, the second inorganic layer 153 covers the auxiliary connection layer 179, and thus contacts the first inorganic layer 151 in the periphery of the auxiliary connection layer 179. Referring to FIG. 10, the second inorganic layer 153 covers the upper power supply line 178, and thus contacts the first inorganic layer 151 in the periphery of the upper power supply line 178. The planarization layer 154 is arranged over the second inorganic layer 153, and the pixel electrode 191 of the organic light-emitting device is placed over the planarization layer 154.

When a display apparatus is manufactured or is used after being manufactured, an impurity such as a gas may be generated from the planarization layer 154 including an organic material. The impurity may damage the TFTs. However, in the display apparatus according to an exemplary embodiment, as described above, the first inorganic layer 151 covers the first conductive layer, the second inorganic layer 153 covers the second conductive layer, and the first inorganic layer 151 and the second inorganic layer 153 contact each other. The first inorganic layer 151 and the second inorganic layer 153 in this structure may function as a protection layer, which may prevent or reduce the occurrence of an impurity such as a gas generated from the planarization layer 154 damaging the TFTs below the planarization layer 154.

Figure 11:
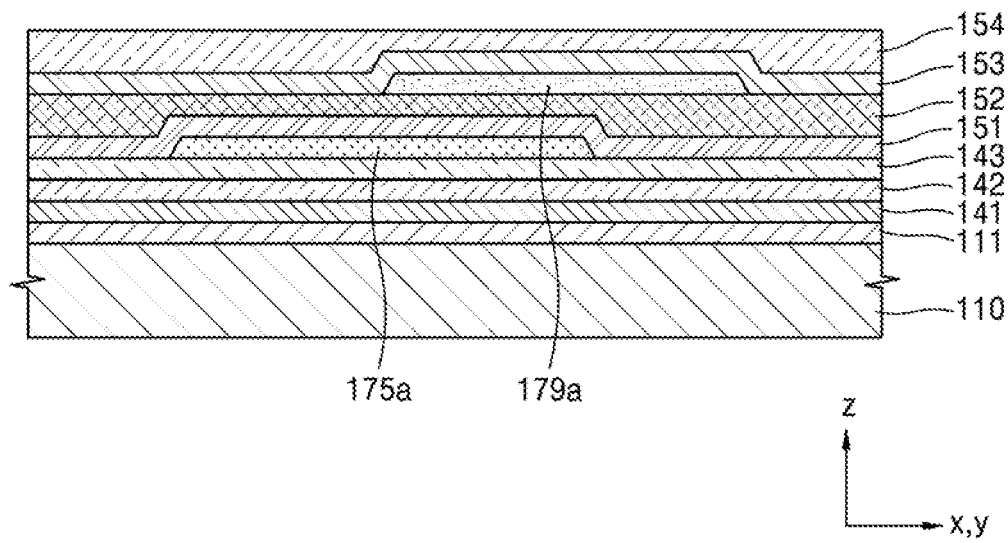
FIG. 11 is a cross-sectional view of a portion XI of FIG. 1, according to an exemplary embodiment of the present disclosure.

FIG. 11 is a cross-sectional view of a portion XI of FIG. 1, which is located in the peripheral area PA, according to an exemplary embodiment of the present disclosure.

As illustrated in FIG. 11, the buffer layer 111, the first gate insulating layer 141, the second gate insulating layer 142, and the interlayer insulating layer 143 may extend over the display area DA and the peripheral area PA. A first wire 175a that may be substantially simultaneously formed from the same material layer as the first conductive layer including the data line 171, the lower power supply line 172, the initialization connection line 173, the connection member 174, and the middle connection layer 175 may be arranged on the interlayer insulating layer 143 in the peripheral area PA. The first inorganic layer 151 may also extend from the display area DA to the peripheral area PA, and thus may protect the first wire 175a by covering the first wire 175a including the same material as the first conductive layer.

An organic material layer 152 may be arranged over the first inorganic layer 151 in the peripheral area PA. The organic material layer 152 may include, for example, acryl, benzocyclobutene (BCB), polyimide, hexamethyldisiloxane (HMDSO), etc. The organic material layer 152 may have a substantially flat top surface. A second wire 179a that may be substantially simultaneously formed from the same material layer as the second conductive layer including the upper power supply line 178 and the auxiliary connection layer 179 may be placed over the organic material layer 152. The second inorganic layer 153 may extend from the display area DA to the peripheral area PA, and thus may protect the second wire 179a by covering the second wire 179a including the same material as the second conductive layer.

The first wire 175a and the second wire 179a may be arranged on different layers and may partially overlap with each other, as illustrated in FIG. 11. With respect to coordinates axes of FIG. 11, an axis indicating an x-y plane may be interpreted as an x-axis of FIG. 1. In this case, the first wire 175a and the second wire 179a may be interpreted as wires that extend in a −y direction in the plan view of FIG. 1. Alternatively, since the first wire 175a and the second wire 179a extend in different directions, the first wire 175a and the second wire 179a may cross each other on different layers. For example, referring to the plan view of FIG. 1, the first wire 175a may extend in the −y direction and the second wire 179a may extend at about 45 degrees with respect to a y-axis, so that the first wire 175a and the second wire 179a may cross each other on different layers.

The first wire 175a and the second wire 179a may be wires used to deliver an electric signal to be applied to a shift register of the display apparatus, may be wires used to deliver an electric signal to be applied to the data line 171 of the display area DA, or may be wires used to deliver an electric signal to be applied to the lower power supply line 172 or the upper power supply line 178 of the display area DA.

Since a resolution of the display apparatus is increased, the number of pixels is increased. Thus, the number of data lines, etc. to be connected to the pixels is also increased. Accordingly, the number of wires in the peripheral area PA is also increased to deliver an electric signal from an integrated circuit device or a printed circuit board to the display area DA.

In the display apparatus according to an exemplary embodiment, as illustrated in FIG. 11, the first wire 175a and the second wire 179a are placed in different layers in the peripheral area PA. By doing so, a line width of each of the first wire 175a and the second wire 179a may be sufficiently large, so that resistance of the first wire 175a and the second wire 179a may not be increased. As a result, a situation in which increased resistance is caused by a line width of each of the wires in a limited space being decreased may be avoided.

According to exemplary embodiments, even if the second wire 179a is placed on the organic material layer 152, the second wire 179a may be sufficiently distant from other wires on the organic material layer 152. This is because, since the first wire 175a and the second wire 179a are placed in different layers in the peripheral area PA, a gap between the wires on the organic material layer 152 is not required to be small. Therefore, even if the second wire 179a is placed on the organic material layer 152, since the second wire 179a is sufficiently distant from other wires on the organic material layer 152, the occurrence of a short between the second wire 179a and other wires due to a patterning error may be prevented.

Figure 12:
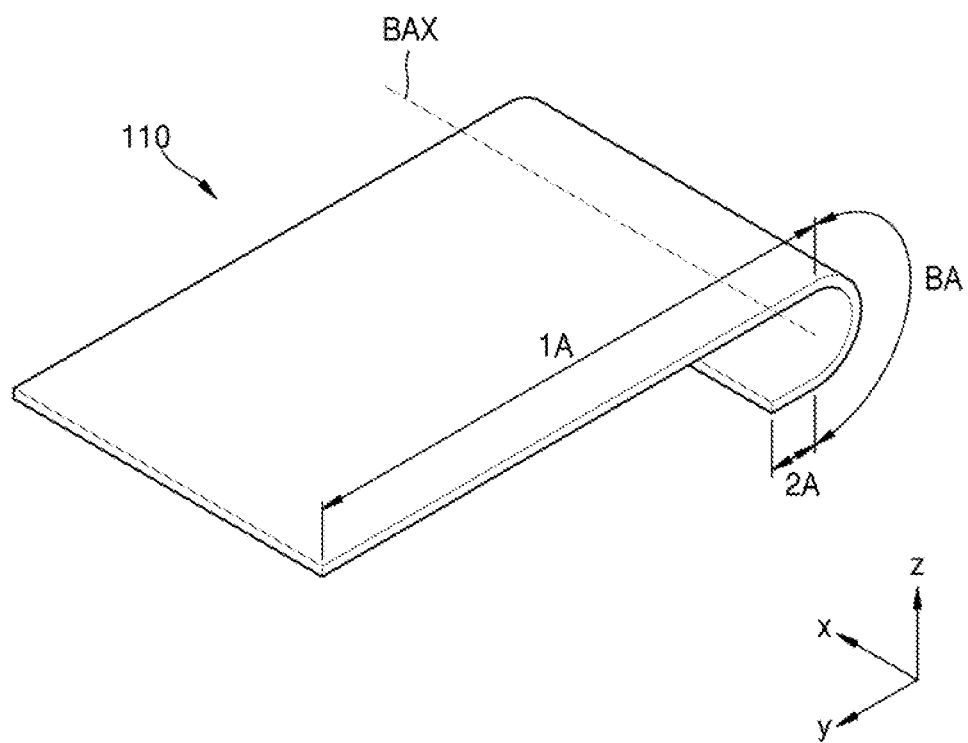
FIG. 12 is a perspective view of a portion of a display apparatus, according to an exemplary embodiment of the present disclosure.

In this manner, by placing the organic material layer 152 between the first wire 175a and the second wire 179a, a display apparatus in which a portion of the substrate 110 is bent in the peripheral area PA may be embodied. For example, as illustrated in FIG. 12, which is a perspective view of a portion of a display apparatus according to an exemplary embodiment, the substrate 110 may have a bending area BA that extends in a first direction (e.g., a +x direction). The bending area BA is located between a first area 1A and a second area 2A in a second direction (e.g., a +y direction) crossing the first direction. The substrate 110 is bent with respect to a bending axis BAX extending in the first direction (e.g., the +x direction) as illustrated in FIG. 12. The substrate 110 may include various materials having a flexible or bendable characteristic. The substrate 110 may include, for example, a polymer resin such as polyethersulfone (PES), polyacrylate, polyetherimide (PEI), polyethylene naphthalate (PEN), polyethyleneterepthalate (PET), polyphenylene sulfide (PPS), polyarylate (PAR), polyimide (PI), polycarbonate (PC), or cellulose acetate propionate (CAP). Referring to FIG. 12, although only the substrate 110 is illustrated as being bent, it is to be understood that various structures disposed over the substrate 110 are also bent in a same manner as the substrate 110.

The first area 1A includes the display area DA as described above. The first area 1A may further include a portion of the peripheral area PA outside the display area DA. The second area 2A also includes the peripheral area PA.

In a case of the display apparatus that is bent in the bending area BA, when the substrate 110 is bent in the bending area BA, a stress may be applied to wires in the bending area BA, thus damaging the wires. However, in the display apparatus according to an exemplary embodiment, an occurrence of a defect in the first wire 175a and the second wire 179a may be prevented or reduced in a bending process. For example, in the display apparatus according to an exemplary embodiment, the organic material layer 152 is placed between the first wire 175a and the second wire 179a. In this regard, since hardness of the organic material layer 152 is lower than that of an inorganic material layer, a stress that is generated in the first inorganic layer 151 or the organic material layer 152, and furthermore, the first wire 175a or the second wire 179a, due to bending of the substrate 110, may be absorbed by the organic material layer 152. As a result, damage to the first wire 175a or the second wire 179a may be reduced or prevented.

To obtain stress absorption by the organic material layer 152, a thickness of the organic material layer 152 may be greater than a thickness of the first inorganic layer 151 and/or the second inorganic layer 153. For example, the thickness of the first inorganic layer 151 and/or the second inorganic layer 153 may be from about 0.5 μm to about 0.6 μm, and the thickness of the organic material layer 152 may be from about 1.6 μm to about 1.8 μm. That is, in an exemplary embodiment, the thickness of the organic material layer 152 may be at least about two times greater than the thickness of the first inorganic layer 151 and/or the second inorganic layer 153.

Figure 13:
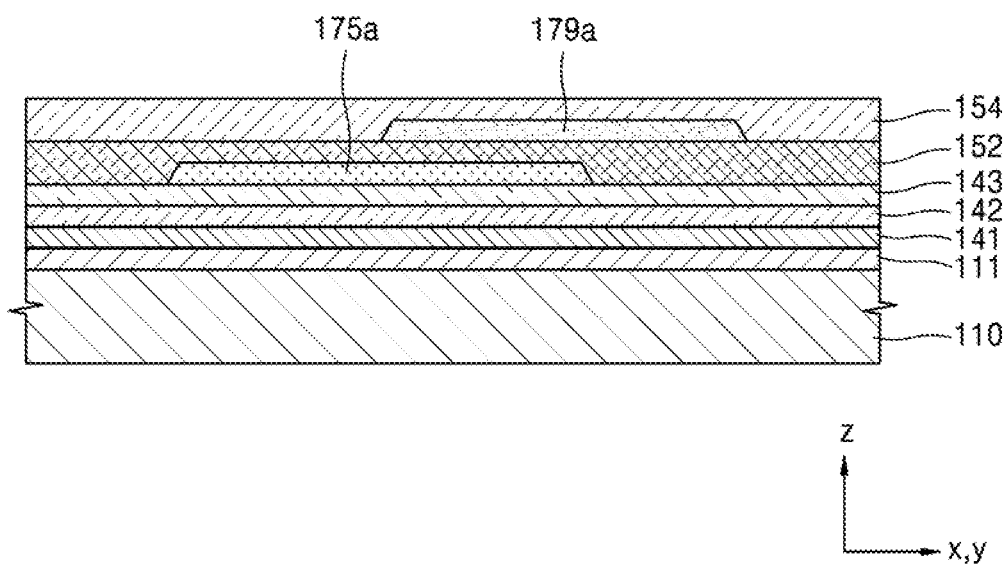
FIG. 13 is a cross-sectional view of a portion of a display apparatus, according to an exemplary embodiment of the present disclosure.

As illustrated in FIG. 13, which is a cross-sectional view of a portion of the bending area BA of the display apparatus according to an exemplary embodiment, unlike the exemplary embodiment illustrated in FIG. 11, the first inorganic layer 151 and the second inorganic layer 153 are not arranged in the bending area BA, and only the organic material layer 152 and the planarization layer 154 are arranged in the bending area BA.

That is, the first inorganic layer 151 may have an opening portion corresponding to the bending area BA, the second inorganic layer 153 may have an additional opening portion corresponding to the opening portion of the first inorganic layer 151, and the organic material layer 152 may fill the opening portion of the first inorganic layer 151.

In this case, the first wire 175a and the second wire 179a are insulated from each other by the organic material layer 152. In this manner, since the first inorganic layer 151 or the second inorganic layer 153 is not arranged in the bending area BA, a level of a stress due to an inorganic layer during a process of bending the substrate 110 may be decreased. In addition, since a stress in the bending area BA due to the process of bending the substrate 110 is absorbed by the organic material layer 152 or the planarization layer 154, damage to the first wire 175a or the second wire 179a may be reduced or prevented.

Referring to FIG. 13, in an exemplary embodiment, the buffer layer 111, the first gate insulating layer 141, the second gate insulating layer 142, and the interlayer insulating layer 143, which are formed of an inorganic material, are arranged in the bending area BA. However, the present disclosure is not limited thereto. For example, at least some of the buffer layer 111, the first gate insulating layer 141, the second gate insulating layer 142, and the interlayer insulating layer 143 may have an opening portion corresponding to the bending area BA. As a result, a level of a stress in the bending area BA during the process of bending the substrate 110 may be decreased.

According to exemplary embodiments of the present disclosure, a display apparatus in which a short among conductive layers is prevented is provided.

In a display apparatus according to a comparative example, a gap between elements of TFTs and/or a gap between wires included in the display apparatus may be decreased in an effort to achieve a display apparatus having a reduced size and/or a high-resolution. When decreasing the gap(s), conductive layers may not be correctly patterned during a manufacturing procedure, resulting in a short occurring between adjacent conductive patterns. As described above, exemplary embodiments of the present disclosure provide a display apparatus in which the occurrence of a short among conductive layers may be prevented.

While the present disclosure has been particularly shown and described with reference to the exemplary embodiments thereof, it will be understood by those of ordinary skill in the art that various changes in form and detail may be made therein without departing from the spirit and scope of the present disclosure as defined by the following claims.

What is claimed is:

1. A display apparatus, comprising:
   a substrate comprising an active area configured to display an image and an inactive area surrounding the active area;
   a plurality of conductive layers disposed in the active area on the substrate;
   a plurality of inorganic layers disposed in the active area on the substrate; and
   a pixel electrode disposed in the active area on the substrate and electrically connected to at least one of the conductive layers,
   wherein a bottom surface of each conductive layer contacts a top surface of a corresponding one of the inorganic layers disposed below the each conductive layer.

2. The display apparatus of claim 1, wherein the bottom surface of the each conductive layer directly contacts the top surface of the corresponding one of the inorganic layers.

3. The display apparatus of claim 2, wherein the each conductive layer is disposed directly above the corresponding one of the inorganic layers.

4. The display apparatus of claim 3,
   wherein the conductive layers comprise a first conductive layer and a second conductive layer disposed above the first conductive layer,
   wherein the inorganic layers comprise an interlayer insulating layer, a first inorganic layer, and a second inorganic layer, and the interlayer insulating layer is disposed below the first conductive layer,
   wherein the first inorganic layer is disposed between the first conductive layer and the second conductive layer and comprises a first opening that exposes at least a portion of the first conductive layer,
   wherein the second conductive layer contacts the first conductive layer via the first opening, and the second inorganic layer covers the second conductive layer and contacts the first inorganic layer outside the second conductive layer.

5. The display apparatus of claim 4, wherein the second inorganic layer comprises a second opening that exposes at least a portion of the second conductive layer.

6. The display apparatus of claim 5, further comprising:
   a planarization layer covering the second inorganic layer and comprising a contact hole corresponding to the second opening in the active area on the substrate,
   wherein the portion of the second conductive layer is exposed by the contact hole and the second opening, and the pixel electrode is disposed over the planarization layer and is electrically connected to the second conductive layer.

* * * * *